United States Patent
Li et al.

(10) Patent No.: US 6,914,014 B2
(45) Date of Patent: Jul. 5, 2005

(54) METHOD FOR CURING LOW DIELECTRIC CONSTANT FILM USING DIRECT CURRENT BIAS

(75) Inventors: Lihua Li, San Jose, CA (US); Tzu-Fang Huang, San Jose, CA (US); Li-Qun Xia, Santa Clara, CA (US); Juan Carlos Rocha-Alvarez, Sunnyvale, CA (US); Maosheng Zhao, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 110 days.

(21) Appl. No.: 10/342,077

(22) Filed: Jan. 13, 2003

(65) Prior Publication Data

US 2004/0137758 A1 Jul. 15, 2004

(51) Int. Cl.⁷ .......................................... H01L 21/3105
(52) U.S. Cl. ...................... 438/781; 438/783; 438/786; 438/789; 438/790; 438/798; 427/489; 427/535; 427/536
(58) Field of Search ................................. 438/778, 780, 438/781, 783, 787, 788, 789, 790, 798; 427/489, 535, 536

(56) References Cited

U.S. PATENT DOCUMENTS 6,133,137 A  * 10/2000 Usami ........................ 438/622
6,147,012 A   11/2000 Sukharev et al. ........... 438/787
6,156,671 A  * 12/2000 Chang et al. ................ 438/778
6,346,488 B1 *  2/2002 Kabansky .................... 438/783
6,431,112 B1    8/2002 Sill et al. ..................... 118/723
6,465,057 B1   10/2002 Nakahigashi et al. ....... 427/569
6,486,061 B1 * 11/2002 Xia et al. .................... 438/680
6,528,432 B1    3/2003 Ngo et al.
6,576,300 B1 *  6/2003 Berry, III et al. ........... 427/489
6,583,046 B1    6/2003 Okada et al.
6,583,497 B2 *  6/2003 Xia et al. .................... 257/642
6,593,247 B1 *  7/2003 Huang et al. ............... 438/758
6,734,118 B2 *  5/2004 Kloster et al. .............. 438/795
6,794,311 B2 *  9/2004 Huang et al. ............... 438/761
6,821,905 B2 * 11/2004 Pan et al. .................... 438/706
6,838,300 B2 *  1/2005 Jin et al. ...................... 438/38

* cited by examiner

*Primary Examiner*—M. Wilczewski
(74) *Attorney, Agent, or Firm*—Moser, Patterson & Sheridan

(57) ABSTRACT

A method for depositing a low dielectric constant film on a substrate. The method includes depositing a low dielectric constant film comprising silicon, carbon, oxygen and hydrogen on the substrate disposed in a chemical vapor deposition chamber, introducing a gas mixture comprising a hydrogen-containing gas to the chemical vapor deposition chamber, forming a plasma of the gas mixture proximate the low dielectric constant film using a radio frequency power, and applying a direct current bias to at least one of the substrate or a gas distribution plate to cure the low dielectric constant film.

47 Claims, 4 Drawing Sheets

METHOD FOR CURING LOW DIELECTRIC CONSTANT FILM USING DIRECT CURRENT BIAS

CROSS-REFERENCE TO RELATED APPLICATIONS

This application is related to U.S. Ser. No. 10/279,367 (AMAT/7522) by Rocha-Alvarez, et al., filed on Oct. 23, 2002 and entitled "PLASMA ENHANCED CVD LOW K CARBON-DOPED SILICON OXIDE FILM DEPOSITION USING VHF-RF POWER", which is incorporated herein by reference.

BACKGROUND OF THE INVENTION

1. Field of the Invention

Embodiments of the present invention relate to the fabrication of integrated circuits. More particularly, embodiments of the present invention relate to a process for depositing dielectric layers on a substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 $\mu$m and even 0.1 $\mu$m feature sizes, and tomorrow's facilities soon will be producing devices having even smaller feature sizes.

The continued reduction in device geometries has generated a demand for films having lower k values because the capacitive coupling between adjacent metal lines must be reduced to further reduce the size of devices on integrated circuits. In particular, insulators having low dielectric constants (k), less than about 4.0, are desirable. Examples of insulators having low dielectric constants include spin-on glass, un-doped silicon glass (USG), fluorine-doped silicon glass (FSG), and polytetrafluoroethylene (PTFE), which are all commercially available.

An effective method to reduce the k value is to introduce pores into the film. As a result, low k films often exhibit poor mechanical strength (e.g., hardness), which may hinder the integration of the films into the manufacture of the device. Plasma post treatment is currently being used to increase mechanical strength of low k films. However, plasma treatment often causes the k value to increase.

A need, therefore, exists for a method for increasing the mechanical strength of low k films without having to increase the k value.

SUMMARY OF THE INVENTION

Embodiments of the present invention are generally directed to a method for depositing a low dielectric constant film on a substrate. The method includes depositing a low dielectric constant film comprising silicon, carbon, oxygen and hydrogen to the substrate disposed in a chemical vapor deposition chamber, introducing a gas mixture comprising a hydrogen-containing gas to the chemical vapor deposition chamber, forming a plasma of the gas mixture proximate the low dielectric constant film using a radio frequency power, and applying a direct current bias to at least one of the substrate or a gas distribution plate to cure the low dielectric constant film.

In one embodiment, the low dielectric constant film is cured by applying a positive direct current bias to a substrate support pedestal that supports the substrate, thereby attracting electrons in the plasma to the low dielectric constant film.

In another embodiment, the low dielectric constant film is cured by applying a negative direct current bias to the gas distribution plate, thereby directing electrons in the plasma toward the low dielectric constant film.

In yet another embodiment, the low dielectric constant film is cured by applying the positive direct current bias to the substrate and applying the negative direct current bias to the gas distribution plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
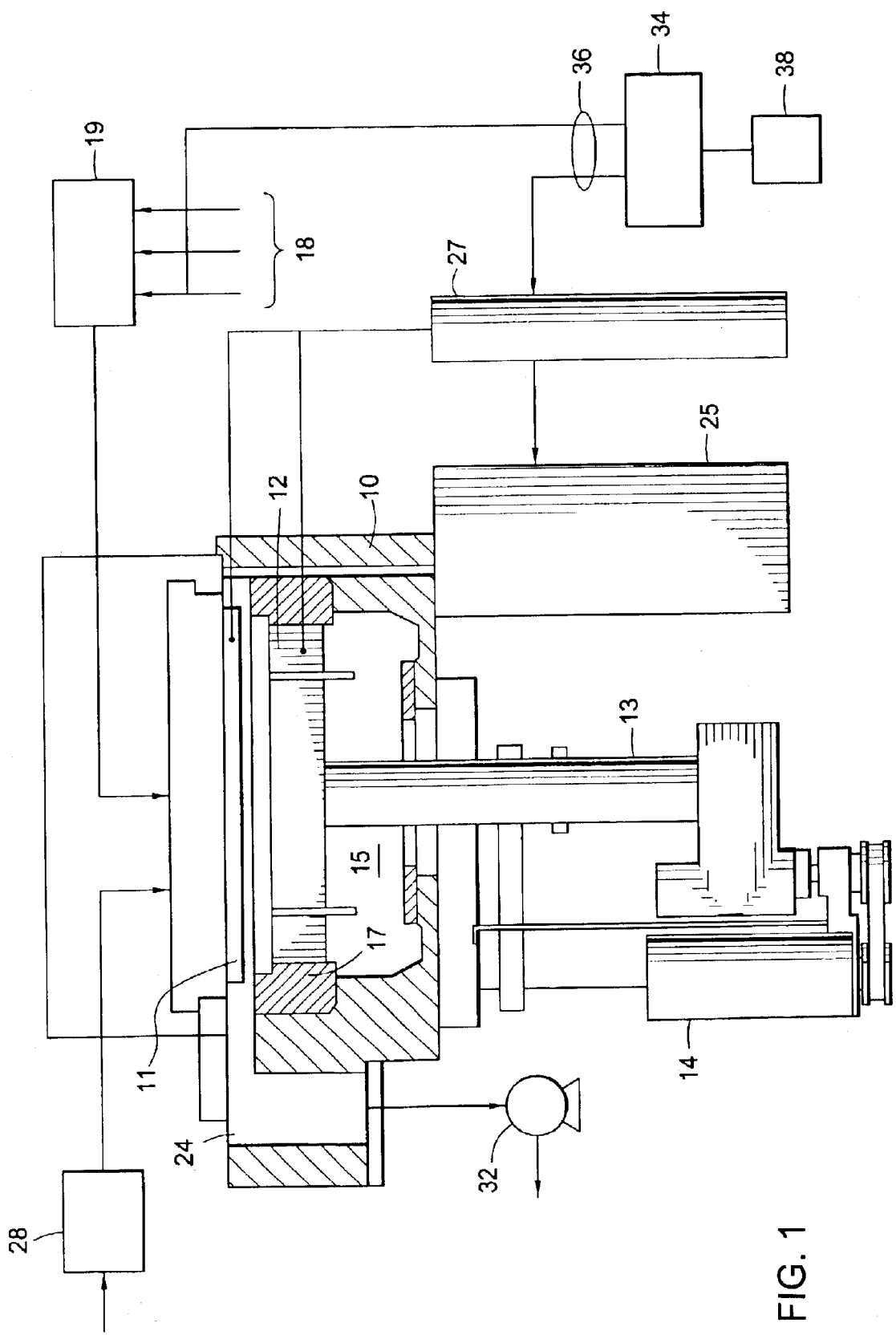
FIG. 1 is a cross-sectional diagram of an exemplary CVD chamber configured for use according to embodiments described herein.

A detailed description will now be provided. Various terms as used herein are defined below. To the extent a term used in a claim is not defined below, it should be given the broadest definition persons in the pertinent art have given that term, as reflected in printed publications and issued patents. Embodiments of the invention provide a significant and unexpected improvement in hardness, cracking threshold and other mechanical properties of an ultra low dielectric constant film. In one embodiment, a film containing silicon, carbon, oxygen, and hydrogen is deposited on a surface of a substrate at conditions sufficient to form an ultra low dielectric constant film (k less than 2.5).

The ultra low dielectric constant film is generally formed by blending or mixing one or more precursor gases, which may include cyclic organosilicon compounds, aliphatic organosilicon compounds, hydrocarbon compounds, and oxidizing compounds. The cyclic organosilicon compounds may include a ring structure having three or more silicon atoms and the ring structure may further comprise one or more oxygen atoms. Commercially available cyclic organosilicon compounds include rings having alternating silicon and oxygen atoms with one or two alkyl groups bonded to the silicon atoms. For example, the cyclic organosilicon compounds may include one or more of the following compounds:

| | |
|---|---|
| 1,3,5-trisilano-2,4,6-trimethylene, | (—SiH$_2$—CH$_2$—)$_3$— (cyclic) |
| 1,3,5,7-tetramethylcyclotetra-siloxane (TMCTS), | (—SiH(CH$_3$)—O—)$_4$— (cyclic) |
| octamethylcyclotetrasiloxane (OMCTS), | (—Si(CH$_3$)$_2$—O—)$_4$— (cyclic) |
| 1,3,5,7,9-pentamethylcyclopenta-siloxane, | (—SiH(CH$_3$)—O—)$_5$— (cyclic) |
| 1,3,5,7-tetrasilano-2,6-dioxy-4,8-dimethylene, | (—SiH$_2$CH$_2$SiH$_2$—O—)$_2$— (cyclic) |
| hexamethylcyclotrisiloxane | (—Si(CH$_3$)$_2$—O—)$_3$— (cyclic) |

The aliphatic organosilicon compounds include linear or branched (i.e. acyclic) organosilicon compounds having one or more silicon atoms, one or more carbon atoms, and linear or branched hydrocarbon compounds having at least one unsaturated carbon bond. The structures may further comprise oxygen. Commercially available aliphatic organosilicon compounds include organosilanes that do not contain oxygen between silicon atoms and organosiloxanes that contain oxygen between two or more silicon atoms. For example, the aliphatic organosilicon compounds may include one or more of the following compounds:

| | |
|---|---|
| methylsilane | CH$_3$—SiH$_3$ |
| dimethylsilane | (CH$_3$)$_2$—SiH$_2$ |
| trimethylsilane | (CH$_3$)$_3$—SiH |
| dimethyldimethoxysilane | (CH$_3$)$_2$—Si—(O—CH$_3$)$_2$ |
| ethylsilane | CH$_3$—CH$_2$—SiH$_3$ |
| disilanomethane | SiH$_3$—CH$_2$—SiH$_3$ |
| bis(methylsilano)methane | CH$_3$—SiH$_2$—CH$_2$—SiH$_2$—CH$_3$ |
| 1,2-disilanoethane | SiH$_3$—CH—CH$_2$—SiH$_3$ |
| 1,2-bis(methylsilano)ethane | CH$_3$—SiH—CH$_2$—CH$_2$—SiH$_2$—CH$_3$ |
| 2,2-disilanopropane | SiH$_3$—C(CH$_3$) 2—SiH$_3$ |
| 1,3-dimethyldisiloxane | CH$_3$—SiH$_2$—O—SiH$_2$—CH, |
| 1,1,3,3-tetramethyldisiloxane (TMDSO) | (CH$_3$)$_2$—SiH—O—SiH—(CH$_3$)$_2$ |
| hexamethyldisiloxane (HMDS) | (CH$_3$)$_3$—Si—O—Si—(CH$_3$)$_3$ |
| 1,3-bis(silanomethylene)disiloxane | (SiH$_3$—CH$_2$—SiH$_2$—)$_2$—O |
| bis(1-methyldisiloxanyl)methane | (CH$_3$—SiH$_2$—O—SiH$_2$—)$_2$—CH$_2$ |
| 2,2-bis(1-methyldisiloxanyl)propane | (CH$_3$—SiH$_2$—O—SiH$_2$—)2—C(CH$_3$)$_2$ |
| hexamethoxydisiloxane (HMDOS) | (CH$_3$—O)$_3$—Si—O—Si—(O—CH$_3$)$_3$ |
| diethylsilane | (C$_2$H$_5$)$_2$SiH$_2$ |
| propylsilane | C$_3$H$_7$SiH$_3$ |
| vinylmethylsilane | CH$_2$=CH—SiH$_2$—CH$_3$ |
| 1,1,2,2-tetramethyldisilane | (CH$_3$)$_2$—S:H—S:H—(CH$_3$)$_2$ |
| hexamethyldisilane | (CH$_3$)$_3$—Si—Si—(CH$_3$)$_3$ |
| 1,1,2,2,3,3-hexamethyltrisilane | (CH$_3$)$_2$—SiH—Si(CH$_3$)$_2$—SiH—(CH$_3$)$_2$ |
| 1,1,2,3,3-pentamethyltrisilane | (CH$_3$)$_2$SiH—SiH(CH$_3$)—SiH(CH$_3$)$_2$ |
| dimethyldisilanoethane | CH$_3$—SiH$_2$—(CH$_2$)$_2$—SiH$_2$—CH$_3$ |
| dimethyldisilanopropane | CH$_3$—SiH—(CH$_2$)$_3$—SiH—CH$_3$ |
| tetramethyldisilanoethane | (CH$_3$)$_2$—SiH—(CH$_2$)$_2$—SiH—(CH$_3$)$_2$ |
| tetramethyldisilanopropane | (CH$_3$)$_2$—SiH—(CH$_2$)$_3$—Si—(CH$_3$)$_2$ |

The hydrocarbon compounds have between one and about 20 adjacent carbon atoms. The hydrocarbon compounds may include adjacent carbon atoms that are bonded by any combination of single, double, and triple bonds. For example, the organic compounds may include alkenes and alkylenes having two to about 20 carbon atoms, such as ethylene, propylene, acetylene, and butadiene.

The one or more oxidizing gases may include oxygen ($O_2$), ozone ($O_3$), nitrous oxide ($N_2O$), carbon monoxide (CO), carbon dioxide ($CO_2$), water ($H_2O$), peroxide ($H_2O_2$) or combinations thereof. In one embodiment, the oxidizing gas is oxygen gas. In another embodiment, the oxidizing gas is ozone. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the amount of ozone desired and the type of ozone-generating equipment used. The one or more oxidizing gases are added to the reactive gas mixture to increase reactivity and achieve the desired carbon content in the deposited film.

The deposited film contains a carbon content between about 5 and about 30 atomic percent (excluding hydrogen atoms), preferably between about 5 and about 20 atomic percent. The carbon content of the deposited films refers to atomic analysis of the film structure that typically does not contain significant amounts of non-bonded hydrocarbons. The carbon contents are represented by the percent of carbon atoms in the deposited film, excluding hydrogen atoms that are difficult to quantify. For example, a film having an average of one silicon atom, one oxygen atom, one carbon atom, and two hydrogen atoms has a carbon content of about 20 atomic percent (one carbon atom per five total atoms), or a carbon content of about 33 atomic percent, excluding hydrogen atoms (one carbon atom per three total atoms, other than hydrogen atoms).

The film may be deposited using any processing chamber capable of chemical vapor deposition (CVD). Referring now FIG. 1, a vertical, cross-section view of a parallel plate CVD processing chamber 10 is illustrated. The chamber 10 includes a high vacuum region 15 and a gas distribution plate 11 having perforated holes for dispersing process gases therethrough to a substrate (not shown). The substrate rests on a substrate support pedestal 12. The substrate support pedestal 12 is mounted on a support stem 13 that connects the substrate support pedestal 12 to a lift motor 14. The lift motor 14 raises and lowers the substrate support pedestal 12 between a processing position and a lower, substrate loading position so that the substrate support pedestal 12 (and the substrate supported on the upper surface of substrate support pedestal 12) can be controllably moved between a lower loading/off-loading position and an upper processing position which is closely adjacent to the gas distribution. plate 11. An insulator 17 surrounds the substrate support pedestal 12 and the substrate when in an upper processing position.

Gases introduced to the gas distribution plate 11 are uniformly distributed radially across the surface of the substrate. A vacuum pump 32 having a throttle valve controls the exhaust rate of gases from the chamber 10 through a manifold 24. Deposition and carrier gases, if needed, flow through gas lines 18 into a mixing system 19 and then to the gas distribution plate 11. Generally, each process gas supply line 18 includes (i) safety shut-off valves (not shown) that can be used to automatically or manually shut off the flow of process gas into the chamber, and (ii) mass flow controllers (also not shown) to measure the flow of gas through the gas supply lines 18. When toxic gases are used in the process, several safety shut-off valves are positioned on each gas supply line 18 in conventional configurations.

During deposition, a blend/mixture of one or more cyclic organosilicon compounds and one or more aliphatic organosilicon compounds are reacted with an oxidizing gas to form an ultra low k film on the substrate. The cyclic organosilicon compounds may be combined with at least one aliphatic organosilicon compound and at least one aliphatic hydrocarbon compound. For example, the mixture contains about 5 percent by volume to about 80 percent by volume of the one or more cyclic organosilicon compounds, about 5 percent by volume to about 15 percent by volume of the one or more aliphatic oganosilicon compounds, and about 5 percent by volume to about 45 percent by volume of the one or more aliphatic hydrocarbon compounds. The mixture also contains about 5 percent by volume to about 20 percent by volume of the one or more oxidizing gases. Alternatively, the mixture may contain about 45 percent by volume to about 60 percent by volume of one or more cyclic organosilicon compounds, about 5 percent by volume to about 10 percent. by volume of one or more aliphatic organosilicon compounds, and about 5 percent by volume to about 35 percent by volume of one or more aliphatic hydrocarbon compounds.

The one or more cyclic organosilicon compounds are typically introduced to the mixing system 19 at a flow rate of about 100 to about 10,000 sccm, preferably about 520 sccm. The one or more aliphatic organosilicon compounds are introduced to the mixing system at a flow rate of about 100 to about 1,000 sccm, preferably about 600 sccm. The one or more aliphatic hydrocarbon compounds are introduced to the mixing system 19 at a flow rate of about 100 to about 10,000 sccm, preferably about 2,000 sccm. The oxygen containing gas has a flow rate between about 100 and about 6,000 scm, preferably about 1,000 sccm. Preferably, the cyclic organosilicon compound is 1,3,5,7-tetramethylcyclotetrasiloxane, octamethylcyclotetrasiloxane, or a mixture thereof, and the aliphatic organosilicon compound is trimethylsilane, 1,1,3,3-tetramethyldisiloxane, or a mixture thereof. The aliphatic hydrocarbon compound is preferably ethylene.

The deposition process can be either a thermal process or a plasma-enhanced process. In a plasma enhanced process, a controlled plasma is typically formed adjacent the substrate by applying RF power to the gas distribution plate 11 using an RF power supply 25. Plasmas are generally produced by introducing a low-pressure process gas into the chamber and then directing electrical energy into the chamber for creating an electric field therein. The electric field creates an electron flow within the chamber which ionizes individual gas molecules by transferring kinetic energy to the molecules through individual electron-gas molecule collisions. The electrons are accelerated within the electric field, producing efficient ionization of the gas molecules. The ionized particles of the gas and the free electrons collectively form what is referred to as a gas plasma.

Alternatively, RF power may be applied to the substrate support pedestal 12. The RF power may also be applied to both the gas distribution plate 11 and the substrate support pedestal 12. In accordance with an embodiment of the invention, the RF power is selected to have a high frequency, i.e., between about 0.01 MHz and 300 MHz, such as about 68 MHz. The high frequency power may be used to promote greater porosity in the deposited film, thereby lowering the dielectric constant. Using the high frequency energy as the excitation energy may also increase the residence time of the gas molecules inside the chamber, thereby enhancing the vapor phase reaction. Furthermore, using the high frequency energy may permit increasing the plasma density at the substrate, thereby increasing the film deposition rate.

Alternatively, the RF power may be delivered using mixed, simultaneous frequencies to enhance the decomposition of reactive species introduced into the high vacuum region 15. In one embodiment, the lower frequency may range between about 400 kHz and about 14 MHz, and the higher frequency may range between about 20 MHz and about 100 MHz. The RF power may also be cycled or pulsed to reduce heating of the substrate. The power density of the plasma for a 300 mm substrate is between about 0.014 W/cm$^2$ and about 2.8 W/cm$^2$, which corresponds to an RF power level of about 10 Watts to about 2000 Watts. Preferably, the RF power level is between about 300 Watts and about 1700 Watts.

During deposition, the substrate is maintained at a temperature between about −20° C. and about 500° C., preferably between about 100° C. and about 400° C. The deposition pressure is typically between about 0.5 Torr and about 20 Torr, preferably between about 2 Torr and about 8 Torr. The deposition rate is typically between about 5,000 A/min and about 20,000 A/min.

When remote dissociation of the oxidizing gas is desired, an optional microwave chamber 28 can be used to input power from between about 50 Watts and about 6,000 Watts to the oxidizing gas prior to the gas entering the processing chamber 10. The additional microwave power can avoid excessive dissociation of the organosilicon compounds prior to reaction with the oxidizing gas. A gas distribution plate (not shown) having separate passages for the organosilicon compound and the oxidizing gas is preferred when microwave power is added to the oxidizing gas.

Typically, any or the entire chamber lining, gas distribution plate 11, substrate support pedestal 12, and various other reactor hardware are made out of materials such as aluminum or anodized aluminum. An example of such a CVD reactor is described in U.S. Pat. No. 5,000,113, entitled "A Thermal CVD/PECVD Reactor and Use for Thermal Chemical Vapor Deposition of Silicon Dioxide and In-situ Multi-step Planarized Process," issued to Wang et al., and assigned to Applied Materials, Inc., the assignee of the present invention, and is incorporated by reference herein to the extent not inconsistent with the invention.

A system controller 34 controls the motor 14, the gas mixing system 19, the RF power supply 25, and the DC power supply 27, which are connected therewith by control lines 36. The system controller 34 controls the activities of the CVD reactor and typically includes a hard disk drive, a floppy disk drive, and a card rack. The card rack contains a single board computer. (SBC), analog and digital input/output boards, interface boards, and stepper motor controller boards. The system controller 34 conforms to the Versa Modular Europeans (VME) standard, which defines board, card cage, and connector dimensions and types. The VME standard also defines the bus structure having a 16-bit data bus and a 24-bit address bus.

Figure 2:
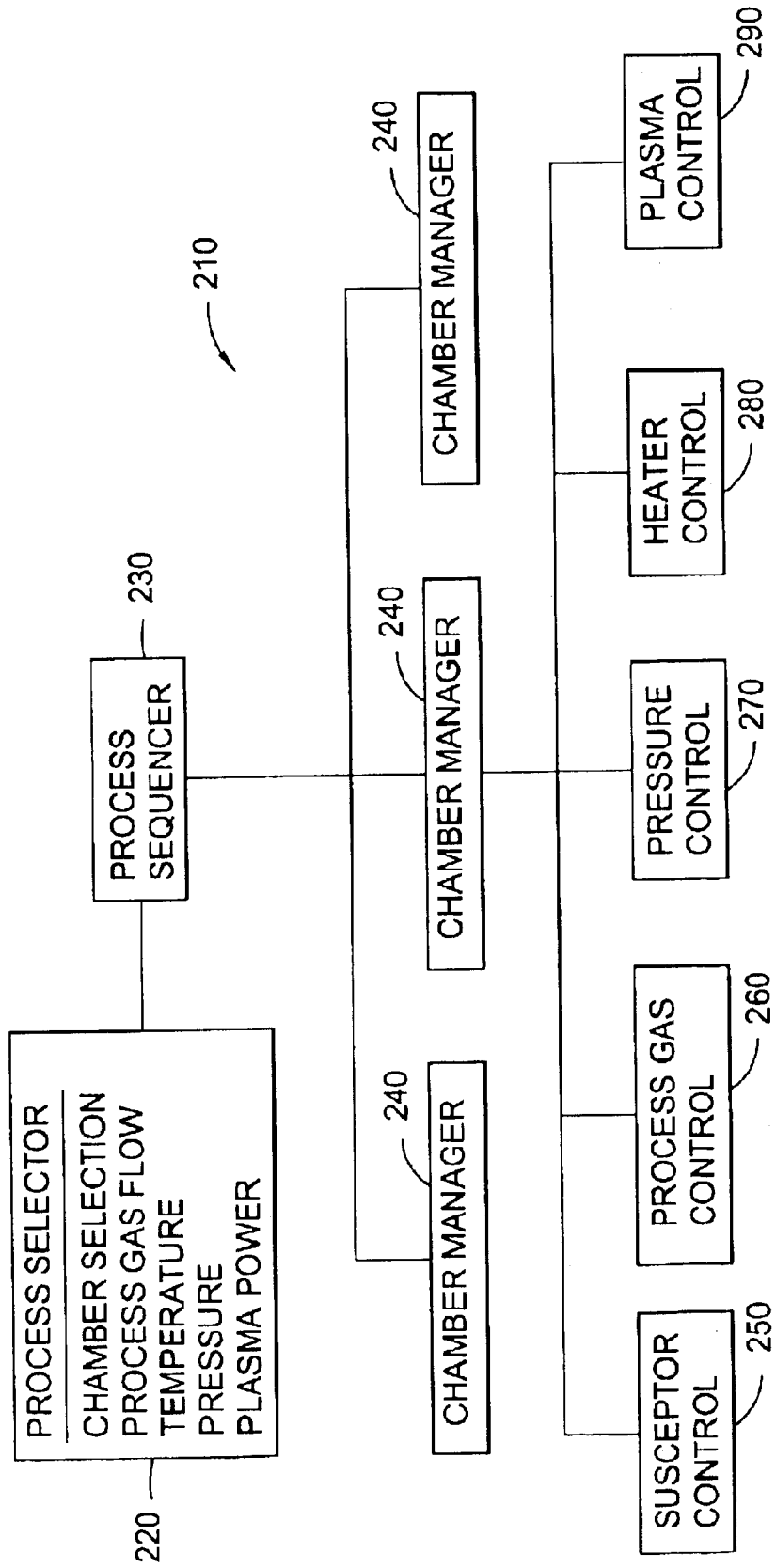
FIG. 2 is an illustrative block diagram of a hierarchical control structure of a computer program configured to be used in connection with the CVD chamber of FIG. 1.

FIG. 2 shows an illustrative block diagram of a hierarchical control structure of a computer program 210 configured to be used in connection with the CVD chamber 10 of FIG. 1. The system controller 34 operates under the control of the computer program 210 stored on a hard disk drive 38. The computer program 210 dictates the timing, mixture of gases, RF power levels, the substrate support pedestal position, and other parameters of a particular process. The computer program code can be written in any conventional computer readable programming language such as, for example, 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

A user enters a process set number and process chamber number into a process selector subroutine 220 in response to menus or screens displayed on the CRT monitor by using the light pen interface. The process sets are predetermined sets of process parameters necessary to carry out specified processes, and are identified by predefined set numbers. The process selector subroutine 220 (i) selects a desired process chamber on the cluster tool, and (ii) selects a desired set of process parameters needed to operate the process chamber for performing the desired process. The process parameters for performing a specific process are provided to the user in the form of a recipe and relate to process conditions such as, for example, process gas composition, flow rates, temperature, pressure, plasma conditions such as RF bias power levels and magnetic field power levels, cooling gas pressure, and chamber wall temperature. The parameters specified by the recipe are entered utilizing the light pen/ CRT monitor interface. The signals for monitoring the process are provided by the analog input and digital input boards of the system controller 34 and the signals for controlling the process are output to the analog output and digital output boards of the system controller 34.

A process sequencer subroutine 230 has program code for accepting the identified process chamber and set of process parameters from the process selector subroutine 220, and for controlling operation of the various process chambers. Multiple users can enter process set numbers and process chamber numbers, or a user can enter multiple process chamber numbers, so the sequencer subroutine 230 operates to schedule the selected processes in the desired sequence. Preferably the sequencer subroutine 230 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling a process execute, the sequencer subroutine 230 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 230 determines which process chamber and process set combination is going to be executed next, the sequencer subroutine 230 causes execution of the process set by passing the particular process set parameters to a chamber manager subroutine 240 which controls multiple processing tasks in a process chamber according to the process set determined by the sequencer subroutine 230. For example, the chamber manager subroutine 240 includes program code for controlling CVD process operations in the process chamber 10. The chamber manager subroutine 240 also controls execution of various chamber component subroutines that control operation of the chamber component necessary to carry out the selected process set. Examples of chamber component subroutines are substrate support pedestal control subroutine 250, process gas control subroutine 260, pressure control subroutine 270, heater control subroutine 280, and plasma control subroutine 290. Those having ordinary skill in the art would readily recognize that other chamber control subroutines can be included depending on what processes are desired to be performed in a processing chamber.

In operation, the chamber manager subroutine 240 selectively schedules or calls the process component subroutines in accordance with the particular process set being executed. The chamber manager subroutine 240 schedules the process component subroutines similarly to how the sequencer subroutine 230 schedules which process chamber and process set is to be executed next. Typically, the chamber manager subroutine 240 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The substrate support pedestal control positioning subroutine 250 has program code for controlling chamber components that are used to load the substrate onto the substrate support pedestal 12, and optionally to lift the substrate to a desired height in the processing chamber 10 to control the spacing between the substrate and the gas distribution plate 11. When a substrate is loaded into the processing chamber 10, the substrate support pedestal 12 is lowered to receive the substrate, and thereafter, the substrate support pedestal 12 is raised to the desired height in the chamber to maintain the substrate at a first distance or spacing from the gas distribution plate 11 during the CVD process. In operation, the substrate support pedestal control subroutine 250 controls movement of the substrate support pedestal 12 in response to process set parameters that are transferred from the chamber manager subroutine 240.

The process gas control subroutine 260 has program code for controlling process gas compositions and flow rates. The process gas control subroutine 260 controls the open/close position of the safety shut-off valves, and also ramps up/down the mass flow controllers to obtain the desired gas flow rate. The process gas control subroutine 260 is invoked by the chamber manager subroutine 240, as are all chamber components subroutines, and receives from the chamber manager subroutine-process parameters related to the desired gas flow rates. Typically, the process gas control subroutine 260 operates by opening the gas supply lines, and repeatedly (i) reading the necessary mass flow controllers, (ii) comparing the readings to the desired flow rates received from the chamber manager subroutine 240, and (iii) adjusting the flow rates of the gas supply lines as necessary. Furthermore, the process gas control subroutine 260 includes steps for monitoring the gas flow rates for unsafe rates, and activating the safety shut-off valves when an unsafe condition is detected.

In some processes, an inert gas such as helium or argon is put into the processing chamber 10 to stabilize the pressure in the chamber before reactive process gases are introduced. For these processes, the process gas control subroutine 260 is programmed to include steps for flowing the inert gas into the chamber 10 for an amount of time necessary to stabilize the pressure in the chamber, and then the steps described above would be carried out.

Additionally, when a process gas is to be vaporized from a liquid precursor, such as OMCTS for example, the process gas control subroutine 260 would be written to include steps for bubbling a carrier/delivery gas such as argon, helium, nitrogen, hydrogen, carbon dioxide, ethylene, or mixtures thereof, for example, through the liquid precursor in a bubbler assembly. The carrier gas typically has a flow rate between about 100 sccm to about 10,000 sccm, preferably 1,000 sccm.

For this type of process, the process gas control subroutine 260 regulates the flow of the delivery gas, the pressure in the bubbler, and the bubbler temperature in order to obtain the desired process gas flow rates. As discussed above, the desired process gas flow rates are transferred to the process gas control subroutine 260 as process parameters. Furthermore, the process gas control subroutine 260 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 270 has program code for controlling the pressure in the processing chamber 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 270 is invoked, the desired, or target pressure level is received as a parameter from the chamber manager subroutine 240. The pressure control subroutine 270 operates to measure the pressure in the processing chamber 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 270 can be written to open or close the throttle valve to a particular opening size to regulate the processing chamber 10 to the desired pressure.

The heater control subroutine 280 has program code for controlling the temperature of the heat modules or radiated heat that is used to heat the substrate support pedestal 12. The heater control subroutine 280 is also invoked by the chamber manager subroutine 240 and receives a target, or set point, temperature parameter. The heater control subroutine 280 measures the temperature by measuring voltage output of a thermocouple located in a substrate support pedestal 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 280 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the processing chamber 10 is not properly set up.

The plasma control subroutine 290 includes program code for setting the RF bias voltage power level applied to the process electrodes in the processing chamber 10, and optionally, to set the level of the magnetic field generated in the reactor. Similar to the previously described chamber component subroutines, the plasma control subroutine 290 is invoked by the chamber manager subroutine 240.

The pretreatment and method for forming a pretreated layer of the present invention is not limited to any specific apparatus or to any specific plasma excitation method. The above CVD system description is mainly for illustrative purposes, and other CVD equipment such as electrode cyclotron resonance (ECR) plasma CVD devices, induction-coupled RF high-density plasma CVD devices, or the like may be employed. Additionally, variations of the above described system such as variations in substrate support pedestal design, heater design, location of power connections and others are possible. For example, the substrate could be supported and heated by a resistively heated substrate support pedestal.

It has recently been observed that the mechanical strength (e.g., film hardness) of a low dielectric film, may be improved by increasing the number of electrons on the film. This increase may be accomplished by biasing either the gas distribution plate 11, the substrate support pedestal 12, or both, with a direct current power supply 27 in the presence of a plasma made of hydrogen-containing gas. Accordingly, once the film is deposited, the gas distribution plate 11 may be biased with a negative direct current power to attract the positive ions in the plasma to the gas distribution plate 11, thereby repelling the electrons from the gas distribution plate 11 toward the substrate surface. Alternatively, the substrate support pedestal 12 may be biased with a positive direct current power to attract the electrons in the plasma to the substrate surface. In accordance with an embodiment of the invention, the gas distribution plate 11 may be biased with a negative direct current power while the substrate support pedestal 12 may be biased with a positive direct current power. The negative direct current bias may range from about 0 to about −400 volts, while the positive direct current bias may range from about 0 to about 400 volts. The direct current biasing may last for about 30 seconds. The hydrogen-containing gas may include hydrogen and other reducing agents. The plasma may be formed using the RF power supply 25 described in earlier paragraphs.

Figure 3:
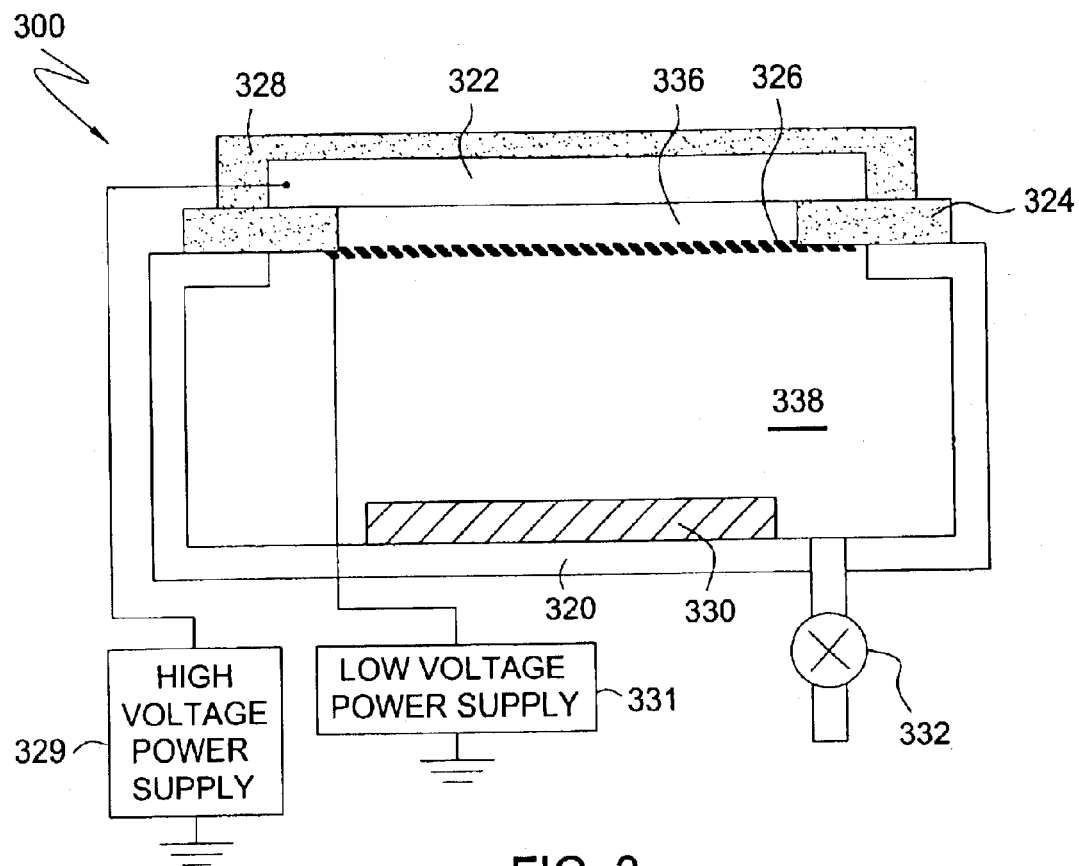
FIG. 3 is an electron beam chamber in accordance with an embodiment of the invention.

In addition to applying the direct current bias to the gas distribution plate 11 or the substrate support pedestal 12 in the presence of hydrogen plasma, the low dielectric film may be exposed to electron beam. Accordingly, the substrate may be transferred to an electron beam (e-beam) chamber for further processing, i.e., curing. The substrate may be transferred with vacuum break or under vacuum, i.e., without any vacuum break. FIG. 3 illustrates an e-beam chamber 300 in accordance with an embodiment of the invention. The e-beam chamber 300 includes a vacuum chamber 320, a large-area cathode 322, a target plane 330 located in a field-free region 338, and a grid anode 326 positioned between the target plane 330 and the large-area cathode 322. The e-beam chamber 300 further includes a high voltage insulator 324, which isolates the grid anode 326 from the large-area cathode 322, a cathode cover insulator 328 located outside the vacuum chamber 320, a variable leak valve 332 for controlling the pressure inside the vacuum chamber 320, a variable high voltage power supply 329 connected to the large-area cathode 322, and a variable low voltage, power supply 331 connected to the grid anode 326.

In operation, the substrate (not shown) to be exposed with the electron beam is placed on the target plane 330. The vacuum chamber 320 is pumped from atmospheric pressure to a pressure in the range of about 1 mTorr to about 200 mTorr. The exact pressure is controlled by the variable rate leak valve 332, which is capable of controlling pressure to about 0.1 mTorr. The electron beam is generally generated at a sufficiently high voltage, which is applied to the large-area cathode 322 by the high voltage power supply 329. The voltage may range from about −500 volts to about −30,000 volts. The high voltage power supply 329 may be a Bertan Model #105-30R manufactured by Bertan of Hickville, N.Y., or a Spellman Model #SL30N-1200X 258 manufactured by Spellman High Voltage Electronics Corp., of Hauppauge, N.Y. The variable low voltage power supply 331 applies a voltage to the grid anode 326 that is positive relative to the voltage applied to the large-area cathode 322, such as from about 0 to about −250 volts. This voltage is used to control electron emission from the large-area cathode 322. The variable low voltage power supply 331 may be an Acopian Model #150PT12 power supply available from Acopian of Easton, Pa.

Figure 4:
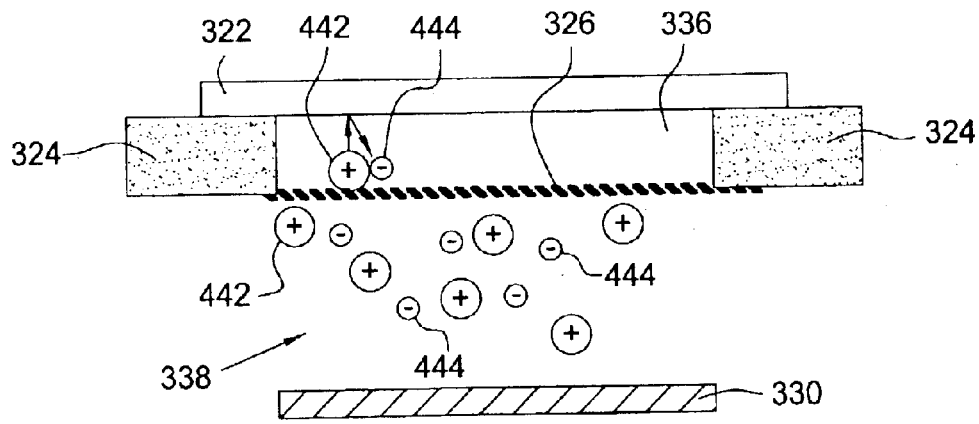
FIG. 4 is a fragmentary view of the electron beam chamber in accordance with an embodiment of the invention.

To initiate electron emission, the gas in the field-free region 338 between the grid anode 326 and the target plane 330 must become ionized, which may occur as a result of naturally occurring gamma rays. Ionization may also be artificially initiated inside the vacuum chamber 320 by a high voltage spark gap. Following the initial ionization, the grid anode 326 is biased with a slightly negative voltage, e.g., from about 0 to about −250 volts, to attract the positive ions 442 (shown in FIG. 4) to the grid anode 326. These positive ions 442 pass into the accelerating field region 336, disposed between the large-area cathode 322 and the grid anode 326, and are accelerated towards the large-area cathode 322 as a result of the high voltage applied to the large-area cathode 322. Upon striking the large-area cathode 322, these high-energy ions produce secondary electrons 444, which are accelerated back toward the grid anode 326. Some of these electrons 444, which travel generally perpendicular to the cathode surface, strike the grid anode 326, but many of these electrons 444 pass through the grid anode 326 and travel to the target plane 330. The grid anode 326 is preferably positioned at a distance less than the mean free path of the electrons emitted by the large-area cathode 322, e.g., the grid anode 326 is preferably positioned less than about 4 mm from the large-area cathode 322. Due to the short distance between the grid anode 326 and the large-area cathode 322, no, or minimal, ionization takes place in the accelerating field region 336 between the grid anode 326 and the large-area cathode 322.

In a conventional gas discharge device, the electrons would create further positive ions in the accelerating field region, which would be attracted to the large-area cathode 322, creating even more electron emission. The discharge could easily avalanche into an unstable high voltage breakdown. However, in accordance with an embodiment of the invention, the ions 442 created outside the grid anode 326, i.e., in the accelerating field region 326, may be controlled (repelled or attracted) by the voltage applied to the grid anode 326. In this manner, the electron emission may be continuously controlled by varying the voltage on the grid anode 326. Alternatively, the electron emission may be controlled by. the variable leak valve 332, which is configured to raise or lower the number of molecules in the ionization region between the target plane 330 and the large-area cathode 322. The electron emission may be entirely turned off by applying a positive voltage to the grid anode 326, i.e., when the grid anode voltage exceeds the energy of any of the positive ion species created in the space between the grid anode 326 and target plane 330.

Figure 5:
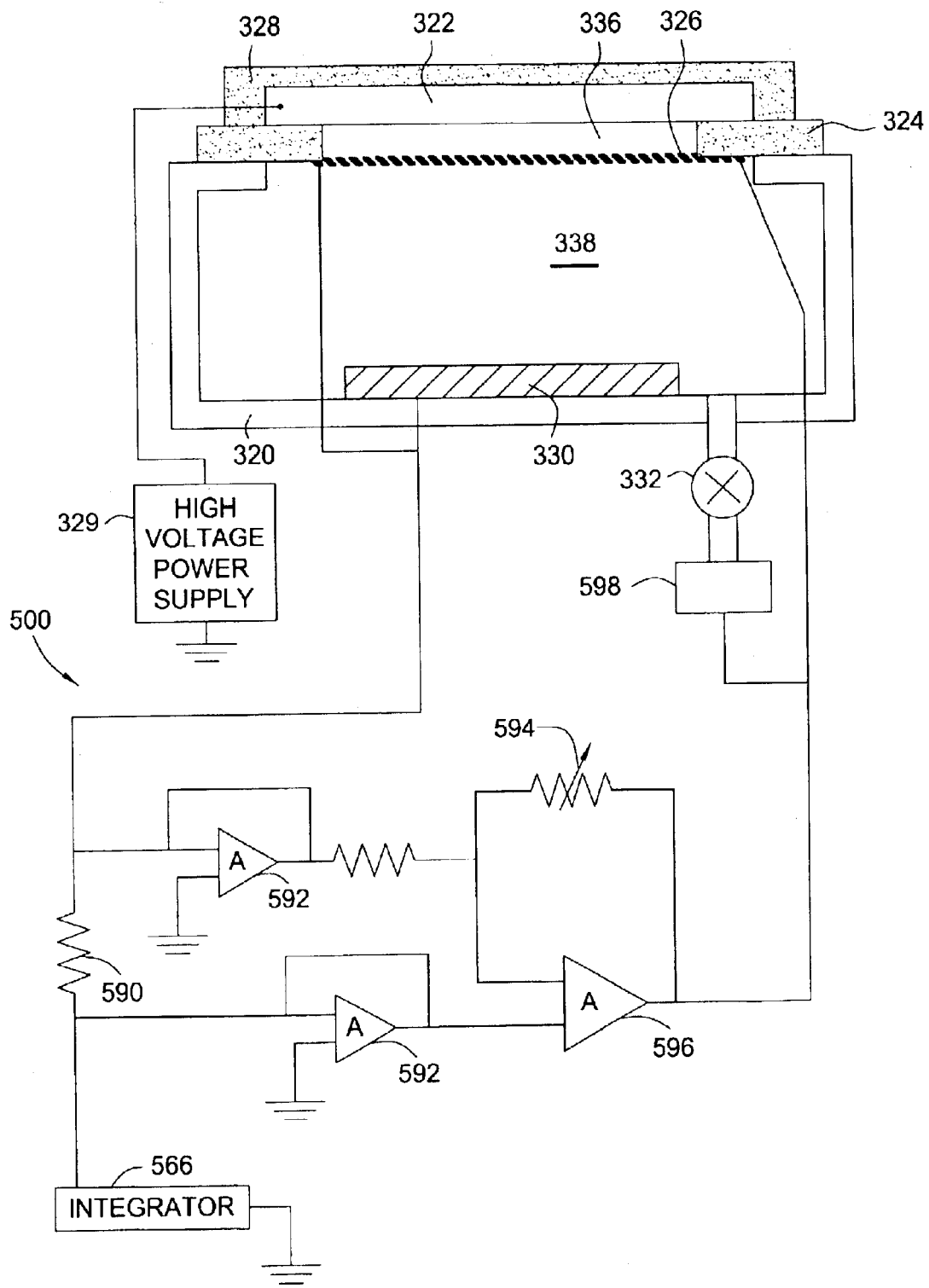
FIG. 5 illustrates the electron beam chamber with a feedback control circuit in accordance with an embodiment of the invention.

FIG. 5 illustrates the e-beam chamber 300 with a feedback control circuit 500. In some applications it may be desirable to provide a constant beam current at different electron beam energies. For example, it may be desirable to expose or cure the upper layer of the film formed on the substrate, but not the bottom layer. This may be accomplished by lowering the electron beam energy such that most of the electrons are absorbed in the upper layer of the film. Subsequent to curing the top layer, it may be desirable to cure the full thickness of the film. This can be done by raising the accelerating voltage of electron beam to penetrate completely through the film. The feedback control circuit 500 is configured to maintain a constant beam current independent of changes in the accelerating voltage. The feedback control circuit 500 includes an integrator 566. The beam current is sampled via a sense resistor 590, which is placed between the target plane 330 and the integrator 566. The beam current may also be sampled at the grid anode 326 as a portion of the beam is intercepted there. Two unity gain voltage followers 592 buffer the signal obtained across the sense resistor 590 and feed it to an amplifier 596 with a variable resistor 594. The output of this amplifier controls the voltage on the grid anode 326 such that an increase in beam current will cause a decrease in bias voltage on the grid anode 326 and a decrease in beam current from the large-area cathode 322. The gain of the amplifier 596 is adjusted, by means of the variable resistor 594, so that any change in beam current caused by a change in the accelerating voltage is counteracted by a change in bias voltage, thereby maintaining a constant beam current at the target. Alternatively, the output of the amplifier 596 may be connected to a voltage controlled variable rate leak valve 398 to counteract changes in beam current by raising or lowering the pressure in the ionization region 338. Further, a wider range of beam current control may be provided by utilizing feedback signals to both the variable leak valve 398 and the grid anode 326. Other details of the e-beam chamber 300 are described in U.S. Pat. No. 5,000,178, entitled "Large-Area Uniform Electron Source", issued to William R. Livesay, assigned to Electron Vision Corporation (which is currently owned by the assignee of the present invention) and is incorporated by reference herein to the extent not inconsistent with the invention.

The temperature at which the e-beam chamber 300 operates ranges from about −200 degrees Celsius to about 600 degrees Celsius, e.g., about 200 degrees Celsius to about 400 degrees Celsius. The electron beam energy ranges from about 0.5 KeV to about 30 KeV. The exposure dose ranges from about 1 $\mu C/cm^2$ to about 400 $\mu C/cm^2$, and more preferably between about 10 to about 300 $\mu C/cm^2$, such as about 70 $\mu C/cm^2$. The electron beams are generally generated at a pressure of about 1 mTorr to about 100 mTorr. The gas ambient in the electron beam chamber 300 may be any of the following gases: nitrogen, oxygen, hydrogen, argon, a blend of hydrogen and nitrogen, ammonia, xenon, or any combination of these gases. The electron beam current ranges from about 1 mA to about 40 mA, and more preferably from about 5 mA to about 20 mA. The electron beam may cover an area from about 4 square inches to about 700 square inches.

While the foregoing is directed to embodiments of the present invention, other and further embodiments of the invention may be devised without departing from the basic scope thereof, and the scope thereof is determined by the claims that follow.

What is claimed is:

1. A method for depositing a low dielectric constant film on a substrate, comprising:

depositing a low dielectric constant film comprising silicon, carbon, oxygen and hydrogen on the substrate disposed in a chemical vapor deposition chamber;

introducing a gas mixture comprising a hydrogen-containing gas to the chemical vapor deposition chamber;

forming a plasma of the gas mixture proximate the low dielectric constant film using a radio frequency power; and applying a direct current bias to at least one of the substrate or a gas distribution plate to cure the low dielectric constant film.

2. The method of claim 1, wherein applying the direct current bias comprises applying a positive direct current bias to the substrate.

3. The method of claim 2, wherein the positive direct current bias is applied to the substrate support pedestal that supports the substrate.

4. The method of claim 2, wherein applying the positive direct current bias to the substrate is configured to attract electrons in the plasma to the low dielectric constant film.

5. The method of claim 2, wherein the positive direct current bias ranges from about 0 to about 400 volts.

6. The method of claim 1, wherein applying the direct current bias comprises applying a negative direct current bias to the gas distribution plate through which the gas mixture is introduced.

7. The method of claim 6, wherein applying the negative direct current bias to the gas distribution plate is configured to direct electrons in the plasma toward the low dielectric constant film.

8. The method of claim 6, wherein the negative direct current bias ranges from about 0 to about −400 volts.

9. The method of claim 1, wherein applying the direct current bias comprises applying a positive direct current bias to the substrate and applying a negative direct current bias to the gas distribution plate.

10. The method of claim 1, wherein the direct current bias is applied for about 30 seconds.

11. The method of claim 1, wherein the hydrogen-containing gas comprises hydrogen.

12. The method of claim 1, wherein the chemical vapor deposition chamber is a plasma-enhanced chemical vapor deposition chamber.

13. The method of claim 1, wherein depositing the low dielectric constant film comprises:
introducing a gas mixture to a substrate surface disposed inside the chemical vapor deposition chamber, wherein the gas mixture comprises one or more compounds selected from a group consisting of cyclic organosilicon compounds, aliphatic organosilicon compounds, hydrocarbon compounds, and oxidizing gases; and
reacting the gas mixture to form the low dielectric constant film on the substrate surface.

14. The method of claim 13, wherein the cyclic organosilicon compounds comprise at least one silicon-carbon bond and at least one silicon-hydrogen bond.

15. The method of claim 13, wherein the hydrocarbon compounds comprise an unsaturated carbon—carbon bond.

16. The method of claim 13, wherein the cyclic organosilicon compounds are selected from the group consisting of 3,5-trisilano-2,4,6-trimethylene, 1,3,5,7-tetramethylcyclotetrasiloxane (TMCTS), octamethylcyclotetrasiloxane (OMCTS), 1,3,5,7,9-pentamethylcyclopentasiloxane, 1,3,5,7-tetrasilano-2,6-dioxy-4,8-dimethylene, and hexamethylcyclotrisiloxane.

17. The method of claim 13, wherein the aliphatic organosilicon compounds are selected from the group consisting of methylsilane, dimethylsilane, trimethylsilane, dimethyidimethoxysilane, ethylsilane, disilanomethane, bis(methylsilano)methane, 1,2-disilanoethane, 1,2-bis(methylsilano)ethane, 2,2-disilanopropane, 1,3-dimethyidisiloxane, 1,1,3,3-tetramethyldisiloxane (TMDSO), hexamethyidisiloxane (HMDS), 1,3-bis(silanomethylene)disiloxane, bis(1-methyldisiloxanyl) methane, 2,2-bis(1-methyldisiloxanyl)propane, diethylsilane, propylsilane, vinylmethylsilane, 1,1,2,2-tetramethyldisilane, hexamethyidisilane, 1,1,2,2,3,3-hexamethyltrisilane, 1,1,2,3,3-pentamethyltrisilane, dimethyldisilanoethane, dimethyldisilanopropane, tetramethyldisilanoethane, and tetramethyldisilanopropane.

18. The method of claim 13, wherein the hydrocarbon compounds are selected from the group consisting of ethylene, propylene, acetylene, butadiene, t-butylethylene, 1,1,3,3-tetramethylbutylbenzene, t-butylether, metylmethacrylate (M MA), and t-butylfurfurylether.

19. The method of claim 13, wherein the cyclic organosilicon compounds are 1,3,5-trisilano-2,4,6-trimethylene, 1,3,5,7-tetramethylcyclotetrasiloxane (TMCTS), octamethylcyclotetrasiloxane (OMCTS), or a mixture thereof.

20. The method of claim 13, wherein the aliphatic organosilicon compounds comprise methylsilane, dimethylsilane, trimethylsilane, or a mixture thereof.

21. The method of claim 13, wherein the hydrocarbon compounds comprise ethylene.

22. The method of claim 1, wherein the radio frequency power has a frequency in a range of about 20 MHz to about 100 MHz.

23. The method of claim 1, wherein the radio frequency power has a frequency of about 68 MHz.

24. The method of claim 1, wherein the radio frequency power comprises a first radio frequency power having a frequency in a range of about 400 Khz to about 14MHz and a second radio frequency power having a frequency in a range of about 20 MHz to about 100 MHz.

25. The method of claim 1, wherein the low dielectric constant film has a dielectric constant less than 2.5.

26. The method of claim 1, further comprising exposing the low dielectric constant film to an electron beam having an exposure dose less than about 400 $\mu C/cm^2$.

27. The method of claim 26, wherein the exposure dose of the electron beam is between about 10 $\mu C/cm^2$ to about 300 $\mu C/cm^2$.

28. A method for depositing a low dielectric constant film on a substrate, comprising:
depositing a low dielectric constant film comprising silicon, carbon, oxygen and hydrogen on the substrate disposed in a plasma enhanced chemical vapor deposition chamber;
introducing a gas mixture comprising a hydrogen-containing gas to the plasma enhanced chemical vapor deposition chamber;
forming a plasma of the gas mixture proximate the low dielectric constant film using a radio frequency power; and
applying a direct current bias to at least one of the substrate or a gas distribution plate in the presence of the plasma to cure the low dielectric constant film.

29. The method of claim 28, wherein applying the direct current bias comprises applying a positive direct current bias to the substrate.

30. The method of claim 29, wherein the positive direct current bias is applied to the substrate support pedestal that supports the substrate.

31. The method of claim 29, wherein the positive direct current bias ranges from about 0 to about 400 volts.

32. The method of claim 28, wherein applying the direct current bias comprises applying a negative direct current bias to the gas distribution plate through which the gas mixture is introduced.

33. The method of claim 32, wherein the negative direct current bias ranges from about 0 to about − 400 volts.

34. The method of claim 28, wherein applying the direct current bias comprises applying a positive direct current bias to the substrate and applying a negative direct current bias to the gas distribution plate.

35. The method of claim 28, wherein the hydrogen-containing gas comprises hydrogen.

36. The method of claim 28, wherein the gas mixture comprises hydrogen gas.

37. A method of depositing a low dielectric constant film on a substrate, comprising:

depositing a low dielectric constant film comprising silicon, carbon, oxygen and hydrogen on the substrate disposed in a plasma enhanced chemical vapor deposition chamber;

introducing a gas mixture comprising hydrogen atoms to the plasma enhanced chemical vapor deposition chamber;

forming a plasma for the gas mixture proximate the low dielectric constant film using a radio frequency power;

applying a direct current bias to at least one of the substrate or a gas distribution plate to cure the low dielectric constant film; and exposing the low dielectric constant film to an electron beam.

38. The method of claim 37, wherein the low dielectric constant film is exposed to the electron beam within the plasma enhanced chemical vapor deposition chamber.

39. The method of claim 37, wherein the low dielectric constant film is exposed to the electron beam within a dedicated electron beam processing system.

40. The method of claim 37, wherein the electron beam has an exposure dose less than about 400 $\mu C/cm^2$.

41. The method of claim 40, wherein the exposure dose of the electron beam is between about 10 $\mu C/cm^2$ to about 300 $\mu C/cm^2$.

42. The method of claim 37, wherein the direct current bias is applied in the presence of the plasma.

43. The method of claim 37, wherein applying the direct current bias comprises applying a positive direct current bias to the substrate.

44. The method of claim 43, wherein the positive direct current bias ranges from about 0 to about 400 volts.

45. The method of claim 37, wherein the positive direct current bias is applied to the substrate support pedestal that supports the substrate.

46. The method of claim 37, wherein applying the direct current bias comprises applying a negative direct current bias to the gas distribution plate through which the gas mixture is introduced.

47. The method of claim 46, wherein the negative direct current bias ranges from about 0 to about -400 volts.

* * * * *

UNITED STATES PATENT AND TRADEMARK OFFICE
CERTIFICATE OF CORRECTION

PATENT NO. : 6,914,014 B2
DATED : July 5, 2005
INVENTOR(S) : Lihua Li et al.

It is certified that error appears in the above-identified patent and that said Letters Patent is hereby corrected as shown below:

Column 1,
Line 37, change "Examples-of" to -- Examples of --.

Column 3,
Line 9, change "(-SiH$_2$CH$_2$SiH$_2$-O-)$_2$- (cyclic)" to
-- (-SiH$_2$-CH$_2$-SiH$_2$-O-)$_2$- (cyclic) --.
Line 33, change "SiH$_3$-CH-CH$_2$-SiH$_3$" to -- SiH$_3$-CH$_2$-CH$_2$-SiH$_3$ --.
Line 34, change "CH$_3$-SiH-CH$_2$-CH$_2$-SiH$_2$-CH$_3$" to -- CH$_3$-SiH$_2$-CH$_2$-CH$_2$-SiH$_2$-CH$_3$ --.
Line 37, change "(CH$_3$)$_3$-S:H-S:H-(CH$_3$)$_2$" to -- (CH$_3$)$_2$-S:H-S:H-(CH$_3$)$_2$ --.

Column 4,
Line 40, delete the period after "distribution".

Column 5,
Line 8, delete the period after "percent".
Line 22, change "scm" to -- sccm --.

Column 6,
Lines 1, 2 and 13, change "Wafts" to -- Watts --.
Line 38, delete the period after "computer".

Column 8,
Line 40, change "subroutine-process" to -- subroutine process --.

Column 10,
Line 56, remove the comma after "voltage".

Column 11,
Line 52, remove the period after "by".

Column 13,
Line 65, change "hexamethyidisiloxane" to -- hexamethyldisiloxane --.

Column 14,
Line 10, change "(M MA)" to -- (MMA) --.
Line 27, "Khz" to -- KHz --.

UNITED STATES PATENT AND TRADEMARK OFFICE
CERTIFICATE OF CORRECTION

PATENT NO. : 6,914,014 B2
DATED : July 5, 2005
INVENTOR(S) : Lihua Li et al.

It is certified that error appears in the above-identified patent and that said Letters Patent is hereby corrected as shown below:

<u>Column 15,</u>
Line 16, change "for" to -- of --.

Signed and Sealed this

Eleventh Day of April, 2006

JON W. DUDAS
*Director of the United States Patent and Trademark Office*